(12) United States Patent
Myrick et al.

(10) Patent No.: US 9,465,734 B1
(45) Date of Patent: Oct. 11, 2016

(54) COALITION BASED MEMORY MANAGEMENT

(71) Applicant: Apple Inc., Cupertino, CA (US)

(72) Inventors: Andrew D. Myrick, San Francisco, CA (US); Lionel Desai, San Francisco, CA (US); Jeremy Andrus, Sunnyvale, CA (US); Karen Crippes, San Jose, CA (US); Joseph Auricchio, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/681,364

(22) Filed: Apr. 8, 2015

(51) Int. Cl.
*G06F 12/02* (2006.01)
*G06F 9/445* (2006.01)
*G06F 12/06* (2006.01)
*G11C 7/10* (2006.01)

(52) U.S. Cl.
CPC ....... *G06F 12/0246* (2013.01); *G06F 9/44526* (2013.01); *G06F 12/0223* (2013.01); *G06F 12/0638* (2013.01); *G11C 7/1072* (2013.01); *G06F 2212/205* (2013.01); *G06F 2212/7201* (2013.01)

(58) Field of Classification Search
CPC ............. G06F 12/023; G06F 12/0233; G06F 2212/1044; G06F 2212/171; G06F 3/0631; G06F 9/445; G06F 9/44526
See application file for complete search history.

(56) References Cited

U.S. PATENT DOCUMENTS

| 6,275,857 | B1 | 8/2001 | McCartney | |
|---|---|---|---|---|
| 8,046,556 | B2 | 10/2011 | Hassan | |
| 8,108,632 | B2 | 1/2012 | Van Riel et al. | |
| 8,381,288 | B2 | 2/2013 | Sahita et al. | |
| 8,635,630 | B2 | 1/2014 | Iyer et al. | |
| 8,850,154 | B2 | 9/2014 | Kisel | |
| 9,317,304 | B2 * | 4/2016 | Collado | G06F 9/445 |
| 2006/0230246 | A1 * | 10/2006 | Mather | G06F 12/0223 711/170 |
| 2008/0168235 | A1 | 7/2008 | Watson et al. | |
| 2010/0318997 | A1 | 12/2010 | Li et al. | |
| 2011/0179483 | A1 | 7/2011 | Paterson et al. | |
| 2012/0179882 | A1 * | 7/2012 | Bernhard, III | G06F 9/5022 711/156 |
| 2014/0033271 | A1 * | 1/2014 | Barton | H04L 67/10 726/1 |
| 2014/0173227 | A1 * | 6/2014 | Min | G06F 3/0644 711/159 |
| 2014/0282606 | A1 * | 9/2014 | Clark | G06F 9/461 718/108 |
| 2015/0026415 | A1 * | 1/2015 | Clausen | G06F 12/0862 711/137 |

OTHER PUBLICATIONS

PCT International Search Report and Written Opinion of the International Searching Authority for PCT/US2016/022987 mailed Jun. 28, 2016.

* cited by examiner

*Primary Examiner* — Hal Schnee
(74) *Attorney, Agent, or Firm* — Blakely, Sokoloff, Taylor & Zafman LLP

(57) ABSTRACT

One or more memory coalitions of software processes are created and used to decide whether to perform memory reduction operations on a data processing system. One method in one embodiment includes adding a newly launched second process to an existing memory coalition in response to determining that the second process should be part of a memory coalition that includes a first process. In response to determining that available system memory (e.g. DRAM) is low, the system determines which memory coalition of foreground applications uses the most amount of system memory and then performs one or more memory reduction operations on that memory coalition in order to make more system memory available to other processes.

22 Claims, 9 Drawing Sheets

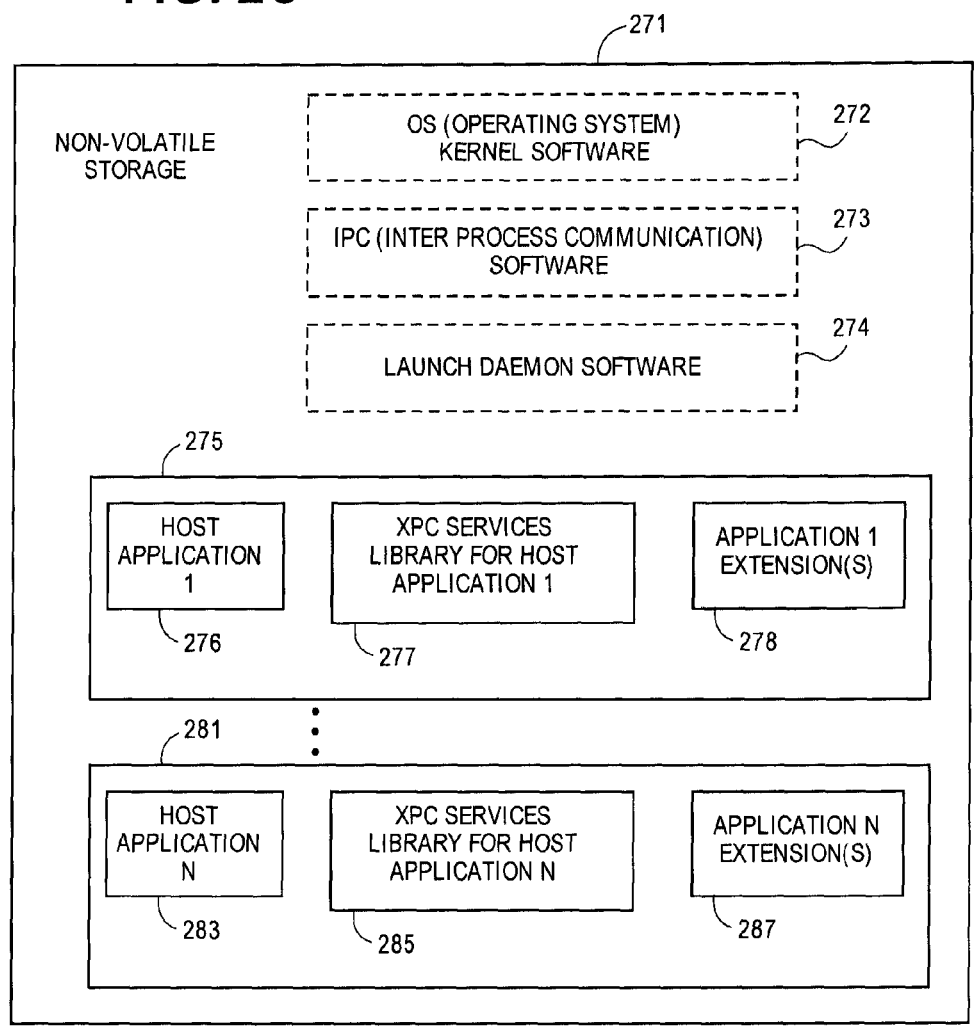

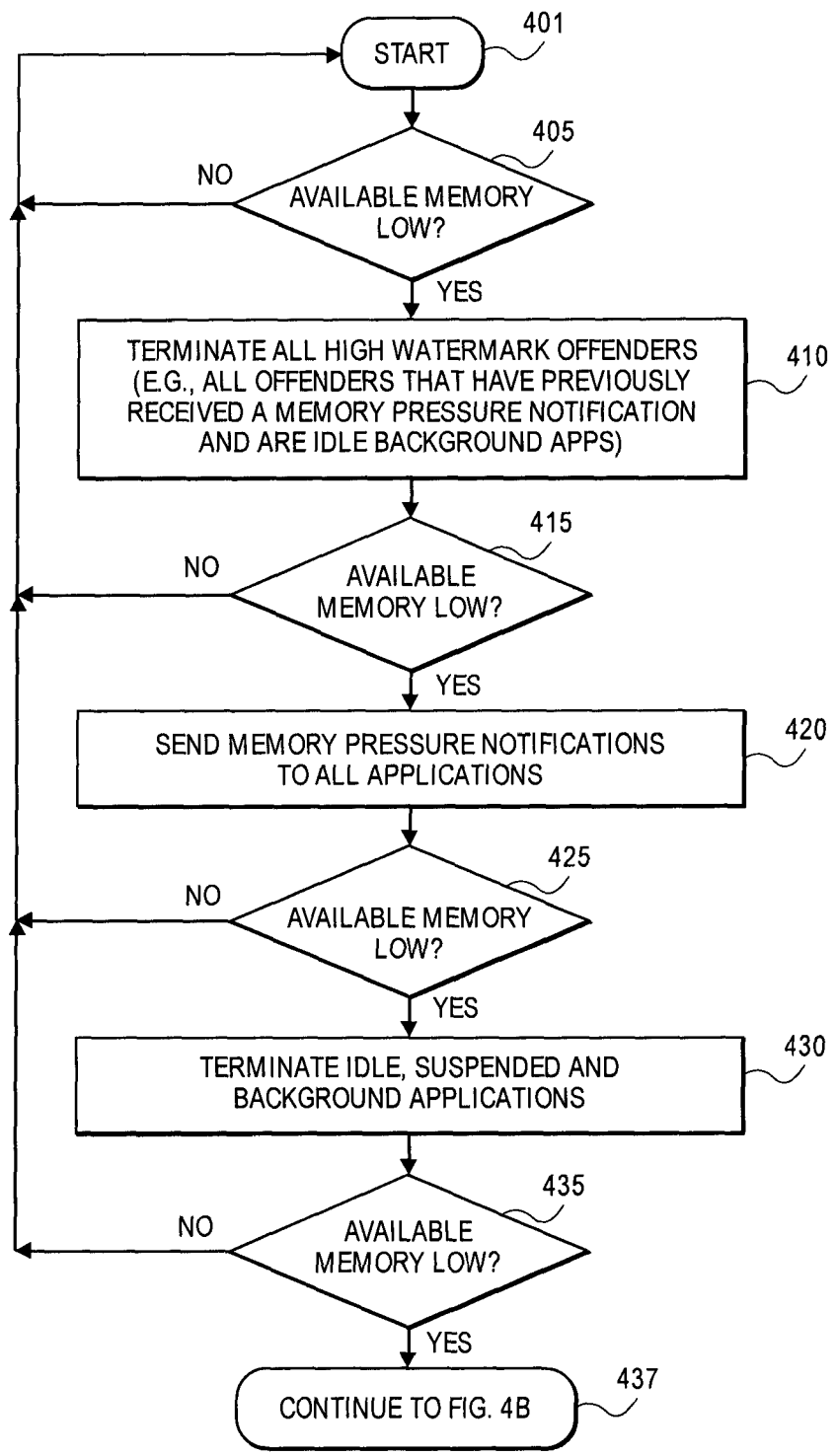

COALITION BASED MEMORY MANAGEMENT

BACKGROUND OF THE INVENTION

This disclosure relates to resource management in data processing systems and more particularly to memory management by an operating system which controls a data processing system.

An operating system (OS), such as iOS or OS X from Apple Inc. or Microsoft Windows from Microsoft, is a collection of software that manages device hardware resources and provides common services for computer programs such as application software. Application software can be considered to be the computer program that causes a computer or other data processing system to perform useful tasks in response to user requests or other requests or other inputs. A specific instance of application software is called a software application, application program, application or app, which are used interchangeably herein. Application programs usually require an operating system to function.

As more and more apps and services are becoming available for small or mobile devices (e.g., a smartphone), the number of applications running at the same time in a single device has increased significantly. Moreover, many of these applications are not terminated or quit by a user after a user finishes using them so they continue to run and therefore continue to use system resources such as memory (e.g. volatile memory such as DRAM) even when they are no longer being used. Furthermore, idle background and foreground applications, while they may not use processing or computation resources, such as one or more microprocessors, they often use memory resources such as RAM while they are idle and not in use. These multiple applications or processes in the same device compete with each other by sharing the same memory resources and computation resources embedded within a device, and the operating system performs resource management, such as memory management, to deal with resource contention in concurrent computing. Memory management to control use of memory by running or idle applications has included techniques to terminate applications based on one or more indications of use of memory (e.g. DRAM) in a data processing system. U.S. Pat. Nos. 7,827,358 and 8,892,827 and published U.S. patent application numbers 2013/0332936 and 2013/0326166 describe examples of such techniques that also included other techniques such as deleting caches.

SUMMARY OF THE DESCRIPTION

In one or more embodiments described herein, a coalition of a host process, such as a first host application, and any helper processes is used to determine a memory usage amount (e.g. total memory footprint) of the processes in the coalition in order to determine whether or how to perform memory management operations on the coalition or other coalitions of processes. In one embodiment, a coalition can be defined as a group of separate processes that consume memory and are considered together when assessing memory usage for the purposes of memory management. In one embodiment, a system can determine the total memory usage footprint of each coalition and use these determined footprints to select one (or more) coalitions for memory usage reduction operations (such as terminating one or more helper processes in a selected coalition). In one embodiment, a host process is normally the first process launched in its coalition, and the host process causes the launching of helper processes that provide services to the host process while the coalition is using memory. When the host process calls (e.g., through an application programming interface (API)) for the launching of a helper process, the system determines whether the helper process should be added to be part of the host process's coalition. If the helper process should be part of the host process's coalition, then that helper process is added to the host process's coalition for the purposes of measuring or otherwise determining the memory usage footprint of that coalition.

A method according to one embodiment includes: executing a first process which can be considered a first host application; determining in response to a launch of a second process whether the second process is part of a first memory coalition that includes the first host application; adding the second process to the first memory coalition in response to determining that the second process is part of the first memory coalition; determining that available memory in the data processing system is low; determining, in response to determining that available memory is low, an amount of memory used by each memory coalition in a set of one or more memory coalitions (which includes the first memory coalition); and performing on the first memory coalition one or more memory usage reduction operations to increase the amount of available memory in response to determining that the first memory coalition uses more memory than any other memory coalition in the set of memory coalitions. In one embodiment, the available memory includes volatile dynamic random access memory (DRAM), and each memory coalition includes a host application and associated one or more processes which are instantiated from software of other host applications or are instantiated from helper software of the host application or from other sources. In one embodiment, the second process can be instantiated from software of a second host application and the second process operates in a second sandbox which is separate and different from a first sandbox in which the first process operates. In one embodiment, memory usage reduction operations are performed on background host applications and other background processes before performing memory usage reduction operations on memory coalitions of one or more foreground applications.

In one embodiment, each memory coalition has a coalition identifier, and the second process is determined to be part of the first memory coalition when the second process is launched through a call that specifies the coalition identifier for the first memory coalition. In one embodiment, the first host application obtains the coalition identifier for the first memory coalition from an operating system component when the first host application is launched.

In one embodiment the first host application is a foreground application when the memory usage reduction operations are performed on the first memory coalition which includes the first host application. In one embodiment, memory reduction operations on background applications are performed without regard to the amount of memory used by the memory coalitions that contain those background applications; in other words, the memory usage footprints of memory coalitions of background applications are not used to determine whether or how memory reduction operations are performed on background applications or processes associated with those background applications. In one embodiment, the first process can be a daemon process. In one embodiment, the second process can be instantiated from software from either a software library provided by an operating system or helper software provided with the first host application, such as a library of helper processes provided with or in a bundle of the first host application.

In one embodiment, each memory coalition in the set of memory coalitions has only one host application and one or more helper processes, with the second process being a helper process. Each helper process in one embodiment belongs to only one memory coalition in its entire life cycle, and when a host application in a memory coalition terminates then all helper processes in that memory coalition also terminate. In one embodiment, when an application is used to instantiate a helper process for more than one memory coalition, a unique instance of that helper process is instantiated for each of the one or more memory coalitions.

In one embodiment, the processes within a memory coalition are grouped into categories that each have a relative priority which specifies an order of implementing memory reduction operations such that processes in one category within a selected memory coalition are terminated before terminating processes in another category within the same selected memory coalition. In one embodiment, the process or main process of the host application in the selected memory coalition is the last process in that memory coalition to be terminated when performing memory reduction operations on that selected memory coalition.

Various data processing systems and methods and non-transitory machine readable media, such as DRAM or flash memory, are described herein as part of the various embodiments described.

The above summary does not include an exhaustive list of all embodiments in this disclosure. All systems and methods can be practiced from all suitable combinations of the various aspects and embodiments summarized above, and also those disclosed in the Detailed Description below.

BRIEF DESCRIPTION OF THE DRAWINGS

The present invention is illustrated by way of example and not limitation in the figures of the accompanying drawings in which like references indicate similar elements.

FIG. 2C shows an example of a non-volatile storage system which can be used to store various software components including various application programs and operating system software components.

FIGS. 4A and 4B are flowcharts illustrating an embodiment of one or more methods for using a memory coalition.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

One or more memory coalitions of software processes are created and used to decide whether to perform memory reduction operations on a data processing system. One method in one embodiment includes adding a newly launched process (referred to as a second process) to an existing memory coalition in response to determining that the second process should be part of a memory coalition that includes a first process. In response to determining that available system memory, such as DRAM, is low, the system determines which memory coalition in a set of memory coalitions of foreground applications uses the most amount of system memory and then performs one or more memory reduction operations on that memory coalition in order to make more system memory available to other processes. In one embodiment, the newly launched second process can be a helper process such as an extension from another software application or host application or can be instantiated from a system-wide library of helper processes or from a library of helper processes provided by the first host application which instantiated the first process. In one embodiment, the first host application can be a web browser and the second host application can be a social network application (e.g., Facebook), and the software from Facebook can include an extension which can be used to create an instance of helper process to allow the web browser to create a post in Facebook or to perform some other Facebook related function while the web browser and the helper process from Facebook remain isolated in their respective sandboxes and communicate with each other through known interprocess communications.

Figure 1:
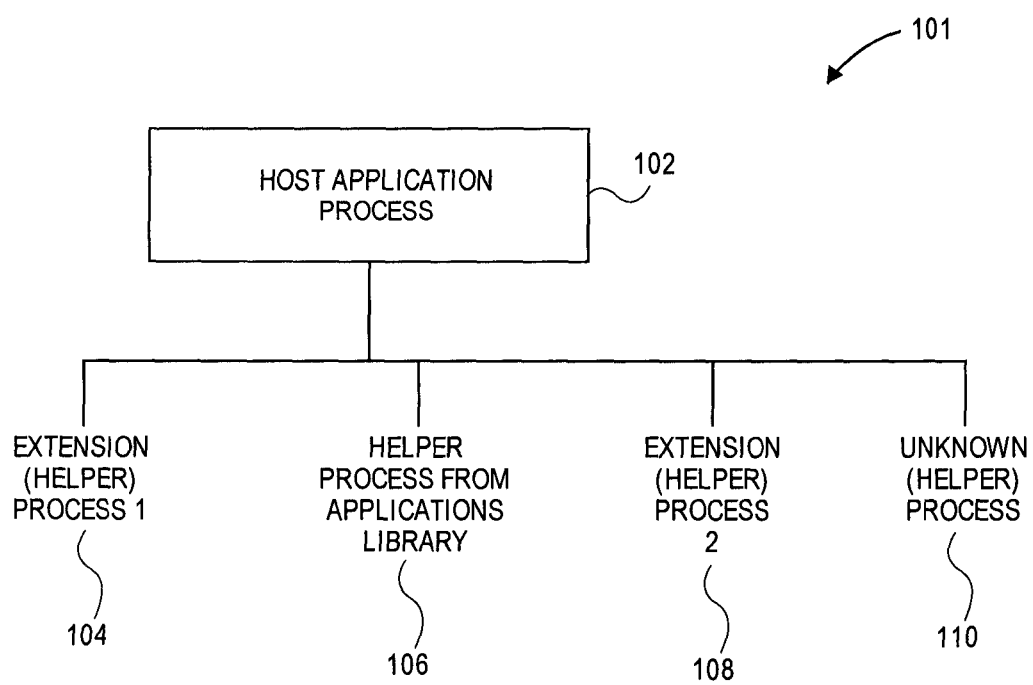
FIG. 1 shows an example of a coalition of processes which can be used in one embodiment described herein.

FIG. 1 shows an example of a coalition of processes 101 which includes a host application process 102, which is the host application of the memory coalition shown in FIG. 1, and also includes several helper processes from different sources of software. Each of these helper processes in one embodiment communicate through software based messages with host process 102 by known interprocess communication procedures. In one embodiment, each of the helper processes can execute in their own separate and distinct sandbox which is separate and distinct from the sandbox in which the host application process 102 executes. In one embodiment, the different helper processes can be categorized in different categories which can be utilized as described herein when determining whether and how to perform memory reduction operations. In one embodiment, the category of each helper process can depend upon a role category assigned to the helper process. For example, extension processes, such as extension process 104 and extension process 108 can originate from other software applications which are different than the host application process 102 and which are different from the software which instantiated the host application process 102. For example, extension process 104 may originate from a different application program which is different than the application program which instantiated host application process 102. Similarly, extension process 108 can be instantiated from a software application which is different than the software application which instantiated host application process 102. For example, referring to FIG. 2A, if the host application process 102 is the web browser application 215, then the extension process 104 can be the extension A 219 which is instantiated from software from a helper process which was included with the software bundle for a social network application shown as host application 201 in FIG. 2A. In one embodiment, the extension process category can be those processes instantiated from other applications which are different than the application program which instantiated application process 102. The helper process 106 can be from a software library which is bundled with or otherwise included with or provided by the software which instantiated application process 102. Helper process 106 has a different role or category than the extension processes 104 and 108. Helper process 110 is an unknown role or unknown process and has its own category of helper processes. In one embodiment, the unknown processes or category has the lowest priority in the sense that those processes which are unknown will be terminated first within a coalition while the host application process will be terminated last. Each of the helper processes 104, 106, 108, and 110 are included within a memory coalition which also includes host application process 102. In one embodiment, the entire memory consumed by all of the processes within this memory coalition shown in FIG. 1 will be totaled together and considered relative to other memory coalitions when determining whether and how to perform memory reduction operations on at least one of the memory coalitions; further information in connection with how, according to one embodiment, memory reduction operations can be performed will be provided further below.

In one embodiment, a data processing system, such as a tablet computer or smartphone or laptop computer or desktop computer or other type of data processing system can include a plurality of application programs in addition to operating system software and other software associated with the operating system to allow the various applications to function with the hardware of the data processing system.

Figure 2A:
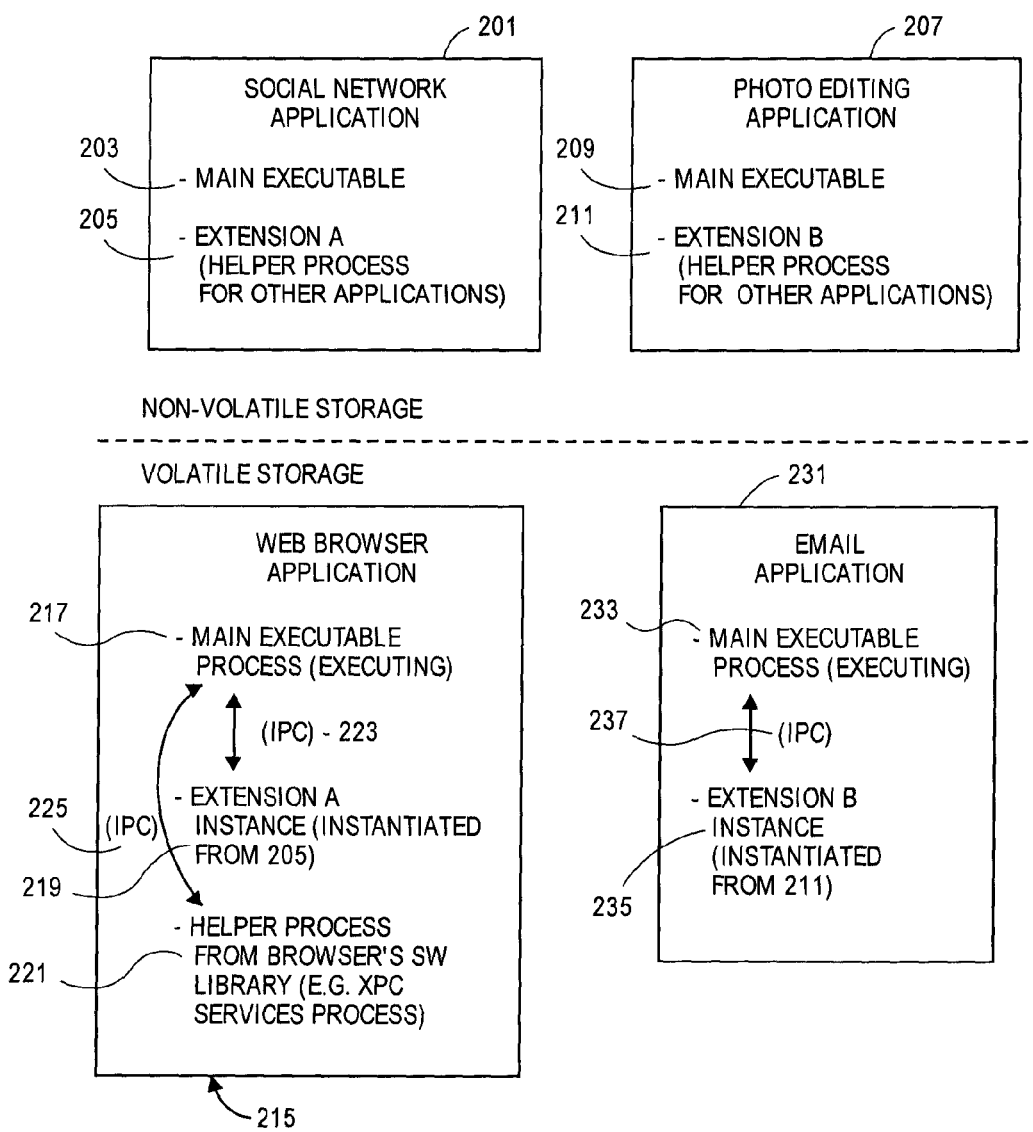
FIG. 2A shows an example of an embodiment of several software applications which can provide helper processes to other software applications which become part of memory coalitions of those other applications.

FIG. 2C shows a generic version of such a software and hardware system while FIG. 2A shows a more particular example of a data processing system which includes at least four application programs (a web browser program, an email program, a photo editing program, and a social network application program). Referring to FIG. 2C, a non-volatile storage system 271 can include several application bundles, such as application bundle 275 and 281 along with several components of an operating system including the operating system's kernel software 272 and interprocess communication software 273 and launch daemon software 274 which can interoperate with the various application bundles and software instantiated or processes instantiated from those application bundles to allow helper processes to perform services for host applications in the manner described herein. Each application bundle shown in FIG. 2C can include a host application which can instantiate a main executable process for the host application, and the bundle can also include application extensions which can provide services for other applications in the manner described herein. For example, application bundle 275 includes a host application 276 from which a main executable process can be instantiated and also includes one or more application extensions 278 which can be used to instantiate extension or helper processes for other applications. Moreover, the application bundle 275 includes one or more helper processes which are part of a services library (e.g. XPC services) included with the host application 276. XPC services are an example of helper processes that can be provided on systems that use the OS X operating system from Apple Inc. of Cupertino, Calif. The application bundle 281 also includes a host application 283 as well as one or more helper processes 285 in the XPC category and one or more application extensions 287 which can provide helper process services to other applications. Kernel software 272 can be similar to conventional kernel software, such as the Mach kernel of the OS X operating system. IPC software 273 can be conventional interprocess communication software which allows for communication between different software processes which are concurrently executing on a data processing system. Launch daemon software 274 can be conventional daemon software which detects the launching of an application or other process and which as a result of the launching instantiates a process or plurality of processes for the software which is launched. In one embodiment, the launch can be as a result of the user tapping on an icon or double clicking on an icon in a graphical user interface as is known in the art.

FIG. 2A shows a particular example of a data processing system which includes four host applications with two of these four being currently executing in volatile storage. In the example shown in FIG. 2A, the non-volatile storage includes stored images of a web browser application and an email application, and the volatile storage includes a web browser process (instantiated by the web browser application) and an email process (instantiated by the email application). The web browser process creates a web browser coalition 215 and the email process creates an email coalition 231. The non-volatile storage also includes a host application bundle 201 for a social network application and a host application bundle 207 for a photo editing application. In one embodiment, the social network application can be a Facebook application and the photo editing application can be the Adobe Photo Shop application. In each case, the host application bundle includes one or more extensions which can be used to instantiate helper processes for other applications. In addition, each application bundle includes an image of the software for the main executable process, such as main executable 203 for the application bundle 201 and main executable 209 for the host application bundle 207. In the example shown in FIG. 2A, a user has launched a web browser application which has instantiated a web browser process in the web browser coalition 215 and has also launched an email application to create an email process in the email coalition 231. The web browser coalition 215 includes a plurality of processes including main executable process 217 (the main web browser process) which is executing currently and an instance of extension A which was instantiated from extension 205 from within the social network application bundle 201, and the web browser coalition 215 also includes a helper process 221 which is instantiated from the web browser's software library in this instance, which can be an XPC service process in one embodiment. The extension A 219 can communicate with the main process 217 through an interprocess communication as known in the art, such as the interprocess communication 223. Similarly, the main process 217 can communicate through an interprocess communication 225 with the helper process 221. In one embodiment, the main process 217 operates in a first sandbox while the extension process 219 operates in a second sandbox and the helper process 221 operates in a third sandbox. In one embodiment, the extension process 219 as well as the extension process or instance 235 can be similar to the extensions described in co-pending U.S. application Ser. No. 14/488,126, filed Sep. 16, 2014, entitled Consistent Extension Points To Allow An Extension To Extend Functionality Of An Application To Another Applications, by inventors Peter Kiehtreiber, Olivier Gutknecht, Ivan Krstic, Adele Peterson, Samuel M. Weinig, Yongjun Zhang, Ian J. Baird, which application is incorporated herein by reference. Extension process 219 can in one embodiment be instantiated in response to a call from the web browser process 217, and this call can result in the performing of process or method shown in FIG. 3 which can cause the extension process 219 to be added to the memory coalition for the web browser coalition 215. For example, in one embodiment, a user of the web browser may go to a social network's website and make a request on the website such as a request to update a Facebook item which in turn causes the web browser to call for the helper process to instantiate the extension 219. This can include parameters specifying the memory coalition identifier of the web browser's memory coalition. Similarly, the helper process 221 can be launched in response to a request in which a web browser calls through an API (which can specify the memory coalition identifier) to cause the launching of the helper process. Email application 231 includes a main process 233 which communications through an interprocess communication 237 with an extension B instance 235 which is instantiated from helper process 211 from the photo editing application 207. In one embodiment, the extension can provide photo editing capabilities within the email application, wherein the photo editing capabilities are provided by the helper process instantiated from software within the bundle 207 of the photo editing application. As noted above, each of the processes within each application 215 and 231 can be implemented and operate within their own separate distinct sandbox to provide enhanced security.

Figure 2B:
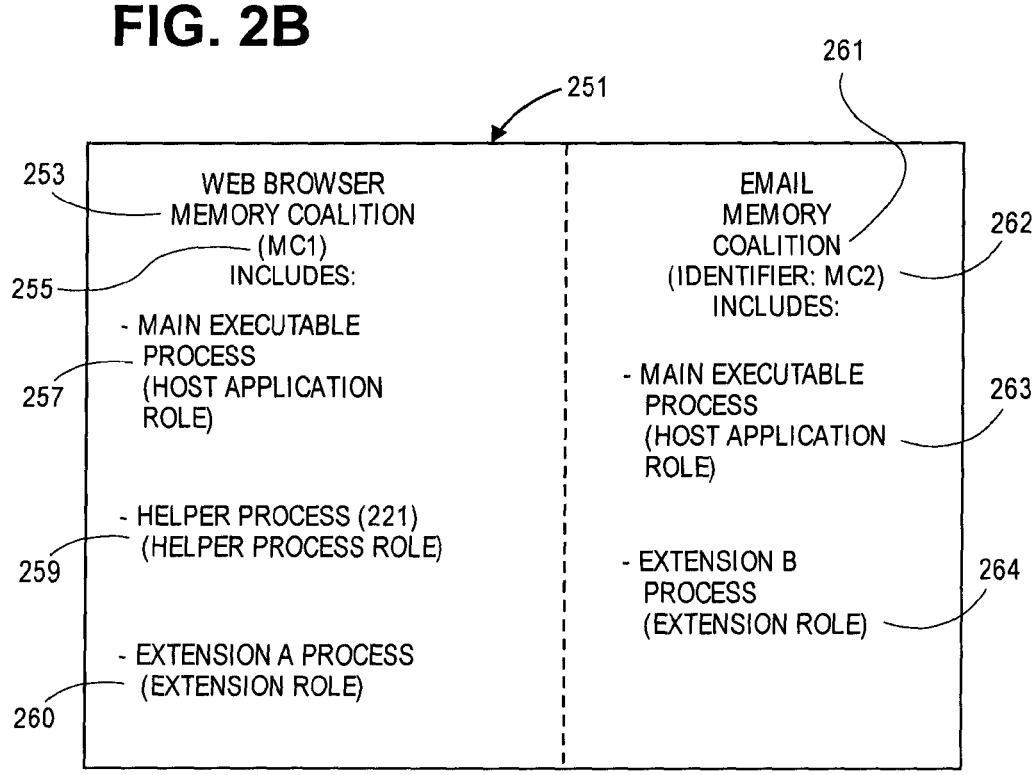
FIG. 2B shows an example of a data structure for a memory coalition according to one embodiment described herein.

FIG. 2B shows an example of a data structure 251 for storing information with respect to one or more memory coalitions. In particular the data structure 251 includes data with respect to two memory coalitions which include web browser memory coalition 253 and email memory coalition 261. This data structure 251 is based on the web browser coalition 215 and the email coalition 231 shown in FIG. 2A; thus, web browser memory coalition 253 corresponds to web browser coalition 215 in FIG. 2A and email memory coalition 261 corresponds to email coalition 231 in FIG. 2A. Each memory coalition can include a memory coalition identifier such as memory coalition identifier 255 and memory coalition identifier 262. Each of these memory coalition identifiers can be assigned by the operating system (OS) at the time of launch of the host process and provided by the OS to each of the host processes. The web browser memory coalition 253 can include metadata 257 for a main executable process for the host web browser application, which has a category or role of host application, and the coalition 253 also includes metadata 259 for a helper process 221 which has a helper process role, and the data structure for the memory coalition 253 also includes metadata 260 for an extension A process which has a role of extension. The memory coalition 261 can also include information with respect to the various processes within that memory coalition including metadata identifying the main executable process 263 for the email application which has a host application role and metadata for an extension process 264 which has an extension role. The data structure 251 can be implemented in a variety of ways known in the art and can be maintained by the operating system for use in its memory management processes as described herein.

The data structure 251 shown in FIG. 2B is one example of information used to define a memory coalition which can be used to then provide information for processes in the memory management system in order to control the uses by processes of a system's memory. In one embodiment, each application coalition can have only one host process in the coalition, and this role of a host application or process cannot be transferred or relinquished at any point in an existing coalition. The termination, in one embodiment, of a host application which has a host role will result in the termination of the coalition and all of its processes within the coalition. In one embodiment, the helper processes are non-host processes but are launched specifically to provide support for the host application, and a process instance can belong to only one coalition in its entire life cycle such that it is launched into that coalition and is part of that coalition until the host application terminates or the helper process instance terminates. In one embodiment, if an application program, such as an email application program or a web browser program or a social network application program provides functionality that is needed by two or more coalitions then a unique instance of that process will be spawned or instantiated into each requesting coalition such that no instance is shared between the coalitions. In one embodiment, an instance is spawned via a posix_spawn (as is known in the art) which can include attributes such as a memory coalition identifier for an existing memory coalition. These calls can include a specification of both a coalition identifier and a coalition role or role identifier such as an identifier indicating whether the helper process is an extension or an XPC service or an unknown process or other types of helper processes. In one embodiment, each non-host process that is launched into a coalition must provide a coalition ID (as an attribute) to the posix_spawn call that will create it and it can specify its role in the coalition using an attribute in that call that will tell the kernel whether that process with an extension or an XPC service or some other role in a coalition.

Each of the processes within a memory coalition may be sandboxed within its own sandbox which is isolated from the sandboxes of the other processes within the memory coalition to provide enhanced security relative to malware, etc. Various different known techniques for sandboxing processes can be used including, for example, the use of one or more of different container directories specifying permitted and accessible (file system) storage locations in a non-volatile storage system for sandboxed processes such that other storage locations in the non-volatile storage are not accessible by the sandboxed process; (b) entitlements specifying what hardware or software resources a sandboxed process is permitted to use and what resources is not permitted to use; or (c) memory space privileges specifying the memory locations the sandboxed process can access such that other memory locations cannot be accessed by the sandboxed process. It will be appreciated that various other additional techniques can be used from the sandboxing art in order to sandbox each process from the other processes and isolate malware in one process from another process.

In one embodiment, as each process is launched in a data processing system, the operating system determines whether the particular newly launched process should be part of an existing memory coalition or is part of a new memory coalition to be created. This allows newly created processes to be partitioned into new or existing memory coalitions in order for the system to manage memory with respect to the memory coalitions which can exist at runtime in the data processing system.

Figure 3:
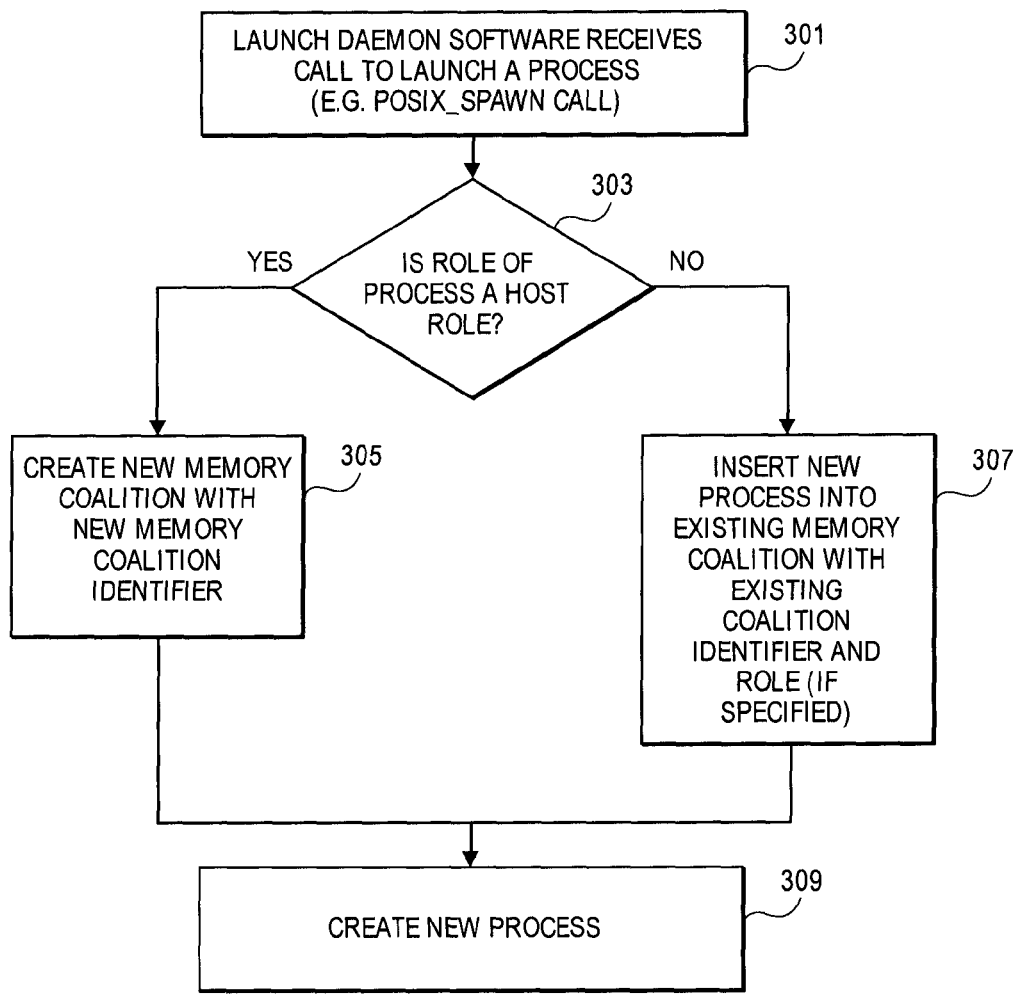
FIG. 3 is a flowchart of a method according to one embodiment for creating and using memory coalitions.

FIG. 3 shows an example of a method which can be employed to create new memory coalitions or manage existing memory coalitions. The method shown in FIG. 3 can be employed in conjunction with the architecture shown in FIGS. 2A through 2C as well as the method shown in FIGS. 4A and 4B to implement a memory management system which utilizes memory coalitions. In operation 301 of the method shown in FIG. 3, a launch daemon software process receives a call to launch a process. In one embodiment, this call can include a coalition role and a coalition ID, although the coalition ID can be created at launch time for a host role if the role of the newly launched process is to be a host application. In response to the call received in operation 301, the operating system determines the role of the process by examining the one or more attributes specified in the call in one embodiment. If the one or more attributes indicates that the process role is the host role, then operation 303 determines that a new memory coalition is to be created in operation 305 with a new memory coalition identifier which is assigned to the host application. In one embodiment, the host application does not know its memory coalition identifier because the system assigns that identifier and uses that identifier without providing that identifier to the host application; for example, a launch daemon software process and the kernel of the OS know and use the memory coalition identifier for each host application, but each host application does not know its own memory coalition identifier. On the other hand, if operation 303 determines that the role of the process is not a host role then operation 307 is performed in which the new process is to be inserted into an existing memory coalition with an existing memory coalition identifier. If the new process includes a role specification then that role is also included within the memory coalition data structure (e.g. data structure 251 shown in FIG. 2B) which can be used when performing memory reduction operations as further explained below. Following either operations 305 or 307, a new process is created in operation 309, which can include instantiating a process from stored software to create an executing process in memory, such as a DRAM. The newly created process is added into an existing memory coalition if the newly created process is not a host application or process, and the memory management system in one embodiment operates according to the various memory coalitions as described herein.

Figure 4B:
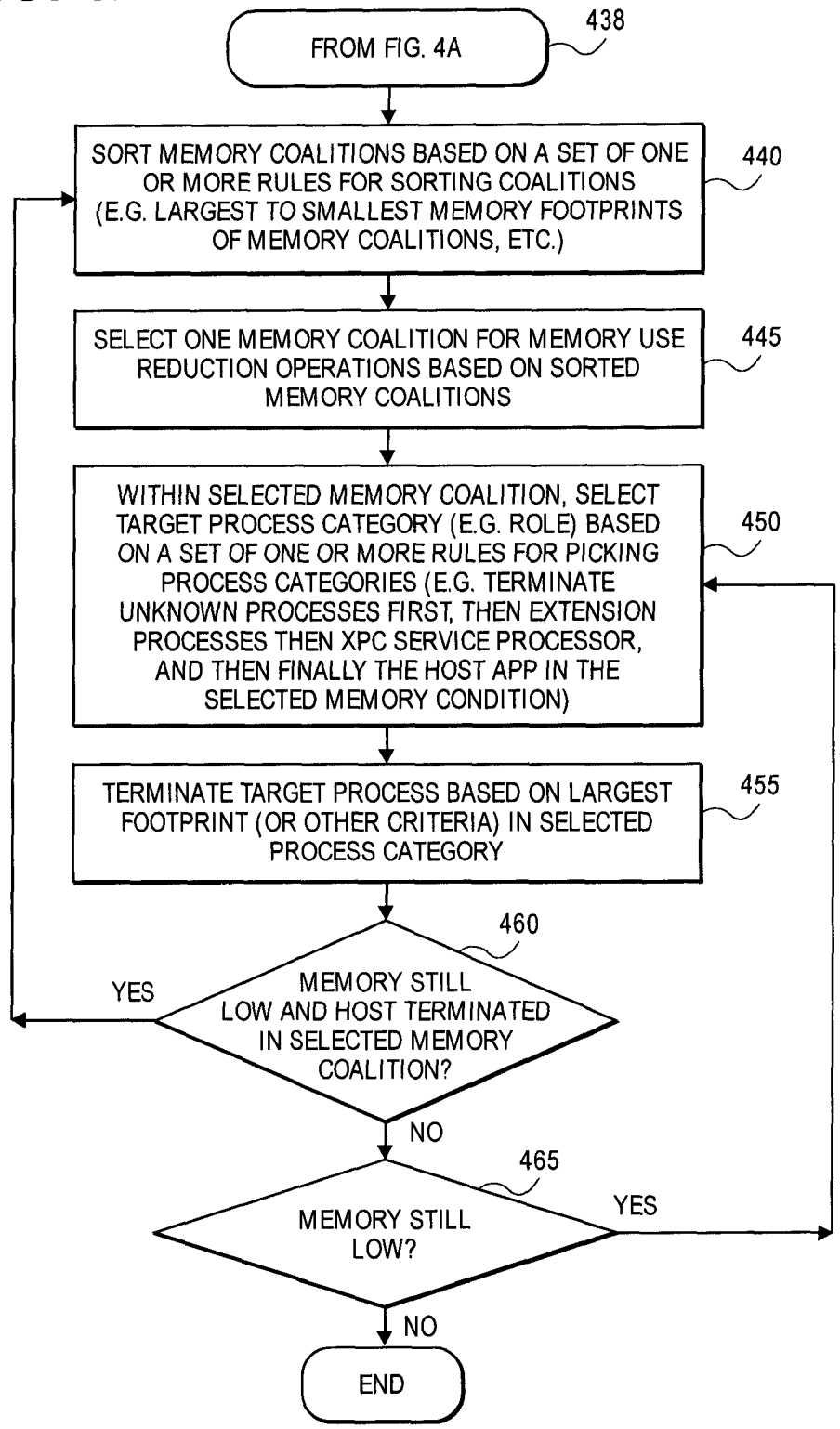
Figure 5:
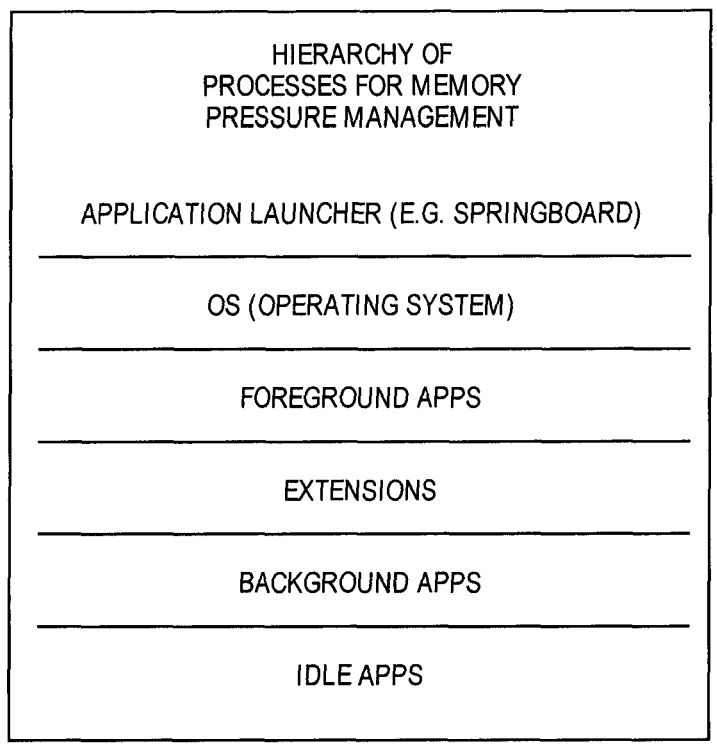
FIG. 5 shows an example of hierarchy of processes which can be used in accordance with the embodiments described herein.

FIGS. 4A and 4B illustrate a method according to one embodiment in which memory coalitions are used in one or more memory management operations to manage the amount of memory which is used by multiple processes in a data processing system. The memory management operations can be implemented by an operating system and can perform many of the same operations that are performed in prior memory management systems including those described in U.S. Pat. Nos. 7,827,358 and 8,892,827 and published U.S. application numbers 2013/0332936 and 2013/0326166, each of which describe examples of techniques for performing memory management operations, and each of which is hereby incorporated herein by reference. Also, co-pending U.S. patent application Ser. No. 14/292,453, filed May 30, 2014 also describes memory management techniques and is also hereby incorporated herein by reference. A memory management process can repeatedly check the status of the memory components of the system including for example DRAM and optionally flash memory or other non-volatile memory in order to determine the status of the memory. The kernel operations can also provide notifications of memory availability or low memory levels. In one embodiment, the determination of whether the system has low memory can be repeatedly performed throughout a memory reduction process in order to determine whether sufficient memory has been freed for further use, and this is shown in FIG. 4A in which operations 405 and 415 and 425 and 435 are performed throughout the process while memory operations are also being performed. The memory management process can begin at operation 401 which proceeds to test the state of the memory in operation 405. If available memory is sufficiently high, the process repeats at some point in time to test the state of the memory; if on the other hand, the available memory is determined to be low based upon one or more benchmarks or other types of thresholds, then operation 410 follows in which, in one embodiment, all high watermark offenders are terminated. In one embodiment, the offenders are those processes which have received prior notices of overuse of memory and can be either idle or background applications which have received this notification. Termination of such offenders can free up available memory which is again tested in operation 415. If memory is still low then operation 420 follows in which a memory pressure notification is sent to all applications which are given an opportunity to perform memory reduction operations such as, for example, deleting caches and other operations which can free up memory to increase available memory. Available memory is again tested in operation 425 after sending the notifications in operation 420. If the available memory is no longer low, the method returns to operation 401; otherwise, if available memory is still low, the system in operation 430 terminates idle, suspended and background applications based upon the priority of the applications. FIG. 5 shows an example of a hierarchy of priorities. The priority can be based upon the recency of use of a process or application or other indications of the importance of the application to a user. After operation 430, the system can then determine again the state of the memory in operation 435, and if memory is still low, then operation 440 can be performed in which the various memory coalitions are sorted based on a set of one or more rules for sorting the coalitions. In one embodiment, the coalitions can be sorted based upon memory usage footprints. In one embodiment, the memory coalitions are used for foreground applications while the prior operations in FIG. 4A have been performed in connection with idle or suspended or background applications (and not with foreground applications). The sorting of memory coalitions based on the one or more rules can allow a system to select one or more memory coalitions for further memory use reduction operations, as shown in operation 445. For example, the system can select the memory coalition that has the largest memory usage footprint. The system can then select in operation 450 a target process category, such as a process role within the selected memory coalition. In one embodiment, the process role is used to rank the processes in a priority order. For example, the system can select an unknown process role within the selected memory coalition and begin terminating all unknown processes within that selected memory coalition. For example, in operation 455 the system can terminate a target process based upon the largest footprint in the selected process category within the selected memory coalition. Then in operation 460, the system can determine whether the memory level is still too low and can then either continue operating on the same selected memory coalition if the host has not been terminated or proceed to other processes within the same memory coalition if the host in that memory coalition has not yet been terminated. In one embodiment, the various process categories or role determine a sequence or order of terminating processes. For example, in one embodiment, unknown processes are terminated first within a selected memory coalition and then extension processes are terminated next within the selected memory coalition and then XPC service processes are terminated next within the selected memory coalition and then finally the host application in the selected memory coalition is terminated.

The operations shown in FIG. 4A in one embodiment can be performed on idle or suspended or background applications before operating on foreground applications, and the foreground applications are processed according to their memory coalition size. The processing of memory reduction operations can take into account various priority levels, such as the hierarchy shown in FIG. 5. In this hierarchy, idle applications will be terminated before background applications are terminated, and background applications will be terminated before extensions are terminated. Finally, extensions will be terminated before foreground applications are terminated, and the processing of memory reduction operations for foreground applications is based upon the memory coalitions of the various foreground applications in the manner described herein.

Figure 6:
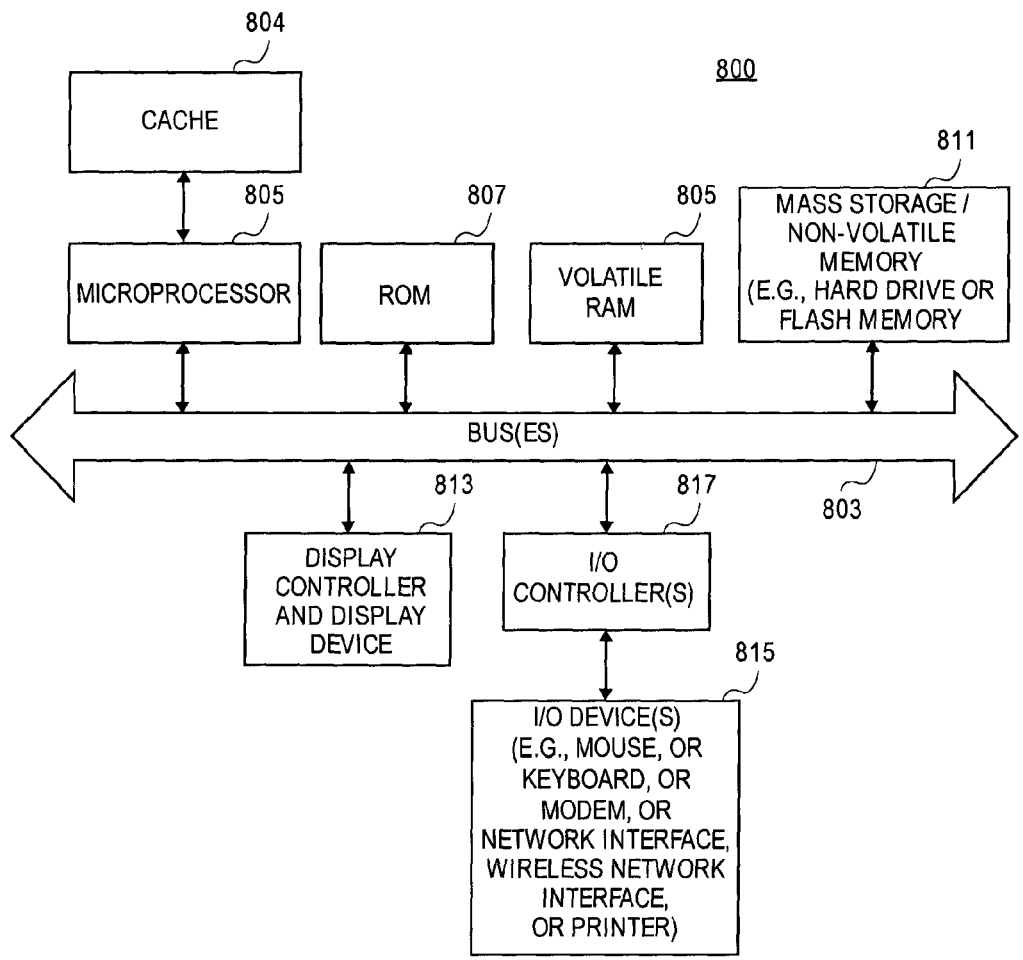
FIG. 6 shows an embodiment of a data processing system which can be used with one or more methods described herein and which can include one or more non-transitory machine readable media, such as volatile DRAM or flash memory, etc.

FIG. 6 shows one example of a data processing system, which may be used with any one of the embodiments described herein. Note that while FIG. 6 illustrates various components of a data processing system, it is not intended to represent any particular architecture or manner of interconnecting the components as such details are not germane to this description. It will also be appreciated that network computers, tablet computers, consumer electronic devices and other data processing systems which have fewer components or perhaps more components may also be used with one or more embodiments described herein.

As shown in FIG. 6, the computer system 800, which is a form of a data processing system, includes a bus 803 which is coupled to one or more microprocessor(s) 805 and a ROM (Read Only Memory) 807 and volatile RAM 809 and a non-volatile memory 811. The microprocessor 805 is coupled to optional cache 804. The microprocessor 805 may retrieve the stored instructions from one or more of the memories 807, 809 and 811 and execute the instructions to perform operations described above. These memories represent examples of machine readable non-transitory storage media that can store or contain computer program instructions which when executed cause a data processing system to perform the one or more methods described herein. The bus 803 interconnects these various components together and also interconnects these components 805, 807, 809 and 811 to a display controller and display device 813 and to peripheral devices such as input/output (I/O) devices 815 which may be one or more of mice, touch screens, touch pads, touch sensitive input devices, keyboards, modems, network interfaces, printers and other devices which are well known in the art. Typically, the input/output devices 815 are coupled to the system through input/output controllers 817. The volatile RAM (Random Access Memory) 809 is typically implemented as dynamic RAM (DRAM) which requires power continually in order to refresh or maintain the data in the memory.

The mass storage 811 is typically a magnetic hard drive or a magnetic optical drive or an optical drive or a DVD RAM or a flash memory or other types of memory system which maintain data (e.g., large amounts of data) even after power is removed from the system. Typically the mass storage 811 will also be a random access memory although this is not required. While FIG. 6 shows that the mass storage 811 is a local device coupled directly to the rest of the components in the data processing system, it will be appreciated that one or more embodiments may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable storage medium storing executable program instructions which when executed by a data processing system cause the data processing system to perform a method comprising:
   executing a first process as a first host application;
   determining in response to a launch of a second process whether the second process should be part of a first memory coalition that includes the first host application;
   adding the second process to the first memory coalition in response to determining that the second process should be part of the first memory coalition;
   determining that available memory in the data processing system is low;
   determining, in response to determining that available memory is low, an amount of memory used by each memory coalition in a set of one or more memory coalitions which includes the first memory coalition;
   performing on the first memory coalition one or more memory usage reduction operations to increase the amount of available memory in response to determining that the first memory coalition uses more memory than other memory coalitions in the set of memory coalitions.

2. The medium as in claim 1 wherein the available memory includes DRAM (dynamic random access memory) and wherein each memory coalition includes a host application and associated one or more processes instantiated from software of other host applications, and wherein the second process is instantiated from software of a second host application and operates in a second sandbox which is separate and different from a first sandbox in which the first process operates.

3. The medium as in claim 2 wherein memory usage reduction operations are performed on background host applications or other background processes before performing memory usage reduction operations on memory coalitions of one or more foreground applications.

4. The medium as in claim 3 wherein each memory coalition has a coalition identifier and wherein the second process is determined to be part of the first memory coalition when the second process is launched through a call that specifies the coalition identifier for the first memory coalition.

5. The medium as in claim 4 wherein the first host application is assigned the coalition identifier for the first memory coalition when the first host application is launched and wherein the first host application is a foreground application when the memory usage reduction operations are performed.

6. The medium as in claim 5 wherein an application is a foreground application when a user interface of the application is presented on a display and wherein memory reduction operations on background applications are performed without regard to the amount of memory used by the memory coalitions that contain those background applications.

7. The medium as in claim 1 wherein the first process is a daemon process and wherein the second process is instantiated from software of an application and the second process operates in a second sandbox which is separate and different from a first sandbox in which the first process operates.

8. The medium as in claim 1 wherein the second process is instantiated from software from (1) a software library provided by an operating system or (2) helper software provided with the first host application.

9. The medium as in claim 1 wherein the second process is instantiated from an image of software stored in non-volatile storage and operates in a second sandbox which is separate and different from a first sandbox in which the first process operates and wherein each of the first and the second sandboxes use one or more of (a) one or more container directories specifying permitted and accessible storage locations in non-volatile memory for a sandboxed process such that other storage locations in non-volatile memory are not accessible by the sandboxed process; (b) entitlements specifying what hardware or software resources a sandboxed process is permitted to use and not use; or (c) memory space privileges specifying the memory locations the sandboxed process can access such that other memory locations cannot be accessed by the sandboxed process.

10. The medium as in claim 9 wherein each memory coalition in the set of memory coalitions has only one host application and one or more helper processes, the second process being a helper process, and wherein each helper process belongs to only one memory coalition in its entire lifecycle, and wherein when a host application in a memory coalition terminates all helper processes in that memory coalition also terminate, and wherein when an application is used to instantiate a helper process for more than one memory coalition, a unique instance of that helper process is instantiated for each of the more than one memory coalition.

11. The medium as in claim 1 wherein the processes within a memory coalition are grouped into categories that each have a relative priority which specifies an order of implementing memory reduction operations such that processes in one category within a selected memory coalition are terminated before terminating processes in another category within the selected memory coalition and wherein the process of the host application in the selected memory coalition is the last process in that memory coalition to be terminated.

12. A machine implemented method comprising:
executing a first process as a first host application;
determining in response to a launch of a second process whether the second process should be part of a first memory coalition that includes the first host application;
adding the second process to the first memory coalition in response to determining that the second process should be part of the first memory coalition;
determining that available memory in the data processing system is low;
determining, in response to determining that available memory is low, an amount of memory used by each memory coalition in a set of one or more memory coalitions which includes the first memory coalition;
performing on the first memory coalition one or more memory usage reduction operations to increase the amount of available memory in response to determining that the first memory coalition uses more memory than other memory coalitions in the set of memory coalitions.

13. The method as in claim 12 wherein the available memory includes DRAM (dynamic random access memory) and wherein each memory coalition includes a host application and associated one or more processes instantiated from software of other host applications, and wherein the second process is instantiated from software of a second host application and operates in a second sandbox which is separate and different from a first sandbox in which the first process operates.

14. The method as in claim 13 wherein memory usage reduction operations are performed on background host applications or other background processes before performing memory usage reduction operations on memory coalitions of one or more foreground applications.

15. The method as in claim 14 wherein each memory coalition has a coalition identifier and wherein the second process is determined to be part of the first memory coalition when the second process is launched through a call that specifies the coalition identifier for the first memory coalition.

16. The method as in claim 15 wherein the first host application is assigned the coalition identifier for the first memory coalition when the first host application is launched and wherein the first host application is a foreground application when the memory usage reduction operations are performed.

17. The method as in claim 16 wherein an application is a foreground application when a user interface of the application is presented on a display and wherein memory reduction operations on background applications are performed without regard to the amount of memory used by the memory coalitions that contain those background applications.

18. The method as in claim 12 wherein the first process is a daemon process and wherein the second process is instantiated from software of an application and the second process operates in a second sandbox which is separate and different from a first sandbox in which the first process operates.

19. The method as in claim 12 wherein the second process is instantiated from software from (1) a software library provided by an operating system or (2) helper software provided with the first host application.

20. The method as in claim 12 wherein the second process is instantiated from an image of software stored in non-volatile storage and operates in a second sandbox which is separate and different from a first sandbox in which the first process operates and wherein each of the first and the second sandboxes use one or more of (a) one or more container directories specifying permitted and accessible storage locations in non-volatile memory for a sandboxed process such that other storage locations in non-volatile memory are not accessible by the sandboxed process; (b) entitlements specifying what hardware or software resources a sandboxed process is permitted to use and not use; or (c) memory space privileges specifying the memory locations the sandboxed process can access such that other memory locations cannot be accessed by the sandboxed process.

21. The method as in claim 20 wherein each memory coalition in the set of memory coalitions has only one host application and one or more helper processes, the second process being a helper process, and wherein each helper process belongs to only one memory coalition in its entire lifecycle, and wherein when a host application in a memory coalition terminates all helper processes in that memory coalition also terminate, and wherein when an application is used to instantiate a helper process for more than one memory coalition, a unique instance of that helper process is instantiated for each of the more than one memory coalition.

22. The method as in claim 12 wherein the processes within a memory coalition are grouped into categories that each have a relative priority which specifies an order of implementing memory reduction operations such that processes in one category within a selected memory coalition are terminated before terminating processes in another category within the selected memory coalition and wherein the process of the host application in the selected memory coalition is the last process in that memory coalition to be terminated.

* * * * *

UNITED STATES PATENT AND TRADEMARK OFFICE
CERTIFICATE OF CORRECTION

PATENT NO. : 9,465,734 B1  
APPLICATION NO. : 14/681364  
DATED : October 11, 2016  
INVENTOR(S) : Myrick et al.

Page 1 of 1

It is certified that error appears in the above-identified patent and that said Letters Patent is hereby corrected as shown below:

In the Claims

Column 14  
Line 10, Claim 12 delete "the" and insert -- a --.

Signed and Sealed this  
Twenty-first Day of February, 2017

Michelle K. Lee  
*Director of the United States Patent and Trademark Office*